United States Patent
Zhang et al.

(10) Patent No.: US 10,642,401 B2
(45) Date of Patent: May 5, 2020

(54) LIGHT DIMMER WITH TOUCH-SENSITIVE CONTROL AND DISPLAY OF ADJUSTMENT MODE CHANGE

(71) Applicant: Long Zhang, Suzhou (CN)

(72) Inventors: Long Zhang, Suzhou (CN); Xiaofeng Chen, Suzhou (CN)

(73) Assignee: Long Zhang, Suzhou (CN)

( * ) Notice: Subject to any disclaimer, the term of this patent is extended or adjusted under 35 U.S.C. 154(b) by 129 days.

(21) Appl. No.: 15/918,157

(22) Filed: Mar. 12, 2018

(65) Prior Publication Data

US 2019/0235684 A1 Aug. 1, 2019

(30) Foreign Application Priority Data

Feb. 1, 2018 (CN) .......................... 2018 1 0101452
Feb. 1, 2018 (CN) ..................... 2018 2 0179832 U

(51) Int. Cl.
*G06F 3/045* (2006.01)
*G06F 3/041* (2006.01)
(Continued)

(52) U.S. Cl.
CPC ......... *G06F 3/0414* (2013.01); *H01H 15/107* (2013.01); *H05B 47/19* (2020.01); *H05K 1/18* (2013.01); *G06F 3/03547* (2013.01); *H01H 1/242* (2013.01); *H01H 9/167* (2013.01); *H01H 2221/044* (2013.01); *H01H 2300/03* (2013.01); *H01H 2300/054* (2013.01);
(Continued)

(58) Field of Classification Search
CPC ..... G06F 3/0414; G06F 3/03547; H05K 1/18; H05K 37/0272; H05B 47/19; H01H 1/242; H01H 9/167; H01H 15/107
See application file for complete search history.

(56) References Cited

U.S. PATENT DOCUMENTS

| 8,344,639 B1 * | 1/2013 | Bahrehmand | ...... H05B 33/0845 |
|---|---|---|---|
| | | | 315/247 |
| 2010/0214756 A1 * | 8/2010 | Feldstein | ............. H01H 9/0271 |
| | | | 361/807 |

(Continued)

FOREIGN PATENT DOCUMENTS

JP 10224199 A * 8/1998

*Primary Examiner* — Adam J Snyder
(74) *Attorney, Agent, or Firm* — Chen Yoshimura LLP

(57) ABSTRACT

A touch-sensitive dimmer, configured to be electrically coupled to an illumination load to adjust an illuminance of the illumination load. It includes a hollow body, a power source printed circuit board assembly (PCBA) disposed inside the body, a control PCBA, and a touch-sensitive display panel, touch-sensing components and a display element disposed on the control PCBA. The display element displays changes of illumination load adjustment modes based on trigger signals generated by the touch-sensing components. The touch-sensitive display panel includes touch keys which correspond to the touch-sensing components and a display window which corresponds to the display element, and is assembled with the control printed circuit board assembly. The touch-sensitive dimmer combines touch-sensing functions and display screen functions to achieve intelligent control. By incorporating a wireless communication module, the dimmer can further achieve remote by a remote control device.

9 Claims, 3 Drawing Sheets

(51) Int. Cl.
  *H05K 1/18*   (2006.01)
  *H05B 47/19*  (2020.01)
  *H01H 15/10*  (2006.01)
  *G06F 3/0354*   (2013.01)
  *H01H 9/16*     (2006.01)
  *H01H 1/24*     (2006.01)

(52) U.S. Cl.
  CPC .............. *H05K 2201/10113* (2013.01); *H05K 2201/10121* (2013.01); *H05K 2201/10136* (2013.01); *H05K 2201/10151* (2013.01)

(56) References Cited

U.S. PATENT DOCUMENTS

| | | | |
|---|---|---|---|
| 2013/0257315 A1* | 10/2013 | Restrepo ............ | H05B 37/0209 315/362 |
| 2014/0239843 A1* | 8/2014 | Hoang ................... | H05B 37/02 315/291 |
| 2015/0373796 A1* | 12/2015 | Bahrehmand ...... | H05B 33/0815 315/129 |
| 2016/0020047 A1* | 1/2016 | Hill ........................ | G06F 3/044 340/12.5 |
| 2016/0307714 A1* | 10/2016 | Bhate ..................... | H01H 13/83 |
| 2017/0024020 A1* | 1/2017 | Kirkpatrick ........... | G06F 3/0238 |
| 2018/0011574 A1* | 1/2018 | Lim ...................... | H01H 35/00 |
| 2018/0114434 A1* | 4/2018 | Newman, Jr. ...... | H05B 37/0218 |
| 2018/0173416 A1* | 6/2018 | Baldwin ............... | G06F 3/04883 |
| 2018/0203560 A1* | 7/2018 | Huang ................. | H03K 17/962 |
| 2018/0228003 A1* | 8/2018 | O'Driscoll ......... | H05B 37/0272 |

\* cited by examiner ured to cooperate with remote control device to remotely control the dimmer.
LIGHT DIMMER WITH TOUCH-SENSITIVE CONTROL AND DISPLAY OF ADJUSTMENT MODE CHANGE

BACKGROUND OF THE INVENTION

Field of the Invention

This invention relates to the technical field of illumination control apparatus, and in particular, it relates to a light dimmer with touch-sensitive control.

Description of Related Art

A dimmer is an electrical device used to adjust the luminous flux and illuminance of a light source of an illumination device. Its operation principle is to adjust the effective current inputted to the light source to achieve adjustment of the luminous flux. One type of conventional dimmers uses a rotating knob to accomplish manual control of the luminous flux and illuminance. Its operation sometimes requires multiple adjustments, making it cumbersome to use. Some other types of conventional dimmers use a push and pull type of manual control, or press-key type of manual control. However, such mechanical devices have limited useful life due to the mechanical components involved, and can become defective during extended use due to mechanical failure. Moreover, the user experience is not ideal.

SUMMARY

Accordingly, an object of the present invention is to provide an improved dimmer apparatus that combines a touch sensing function with a display function, and presents the human-machine interaction functions to the user in a more visual manner. It gives the use a new experience when using the dimmer. Meanwhile, it solves the problems of conventional mechanical dimmers including limited life, cumbersome operation, less-than ideal user experience, etc.

Additional features and advantages of the invention will be set forth in the descriptions that follow and in part will be apparent from the description, or may be learned by practice of the invention. The objectives and other advantages of the invention will be realized and attained by the structure particularly pointed out in the written description and claims thereof as well as the appended drawings.

To achieve the above objects, in one aspect, the present invention provides a touch-sensitive dimmer, configured to be electrically coupled to an illumination load to adjust an illuminance of the illumination load, which includes: a hollow body; a power source printed circuit board assembly disposed inside the body; a control printed circuit board assembly; a touch-sensitive display panel; touch-sensing components and a display element disposed on the control printed circuit board assembly; wherein the display element is configured to display changes of illumination load adjustment modes based on trigger signals generated by the touch-sensing components; and wherein the touch-sensitive display panel includes touch keys which correspond to the touch-sensing components and a display window which corresponds to the display element, and is assembled with the control printed circuit board assembly.

Based on the above, the invention may have various embodiments.

In some preferred embodiments, the display element comprises a liquid crystal display screen and a backlight plate.

In some preferred embodiments, the touch-sensing components include at least one touch spring, wherein the touch keys and the touch spring are configured to cooperate with each other to generate a pressure which controls conductive states of a touch-sensing control circuit on the control print circuit board assembly.

In some preferred embodiments, the control printed circuit board assembly includes a microswitch, and the touch-sensitive display panel further includes an on/off button which is configured to trigger the microswitch.

In some preferred embodiments, the power source printed circuit board assembly includes a mechanical switch which is configured to be triggered to turn off power supply to the illumination load.

In some preferred embodiments, the touch-sensitive display panel and the control printed circuit board assembly are assembled together via a faceplate to form a first assembly, the power source printed circuit board assembly, the body and a grounding frame are assembled together to form a second assembly, and the first assembly and the second assembly are assembled to form the touch-sensitive dimmer.

In another aspect, the present invention provides a touch-sensitive dimmer, configured to be electrically coupled to an illumination load to adjust an illuminance of the illumination load, which includes: a power source module, a microcontroller unit (MCU) control module, a display module, a touch-sensing control circuit module, and an illuminance control circuit module, coupled to each other; wherein the display module is configured to display, based on trigger signals from the touch-sensing control circuit module, an illumination load adjustment mode change effected by the MCU control module, and to control the illuminance control circuit module to adjust the illuminance of the illumination load.

Based on the above, the invention may have various embodiments.

In some preferred embodiments, the touch-sensitive dimmer further includes a wireless communication module config In some preferred embodiments, the touch-sensitive dimmer further includes a zero crossing detection module configured to detect zero crossings of a power supply inputted to the illumination load.

The touch-sensitive dimmer according to embodiments of the present invention combine touch-sensing functions and display screen functions to achieve intelligent control of the dimmer. It is easy to use, avoids mechanical controls, effectively improves the life of the dimmer. By incorporating a wireless communication module, the dimmer can further achieve remote by a remote control device.

BRIEF DESCRIPTION OF THE DRAWINGS

Embodiments and advantages of the invention are described below with reference to the following drawings.

DETAILED DESCRIPTION OF PREFERRED EMBODIMENTS

Embodiments of the present invention and their operation are described in detail below. It should be understood that the embodiments described here serve to illustrate the implementations and operation of the invention, and do not limit the scope of the invention. The directional expressions such as up, down, top, bottom, etc. that are used in the descriptions are relative and not absolute. When the various components are disposed in the illustrated manner, these directional expressions are appropriate; when the arrangements of the components change, the directional expressions may change accordingly.

Figure 3:
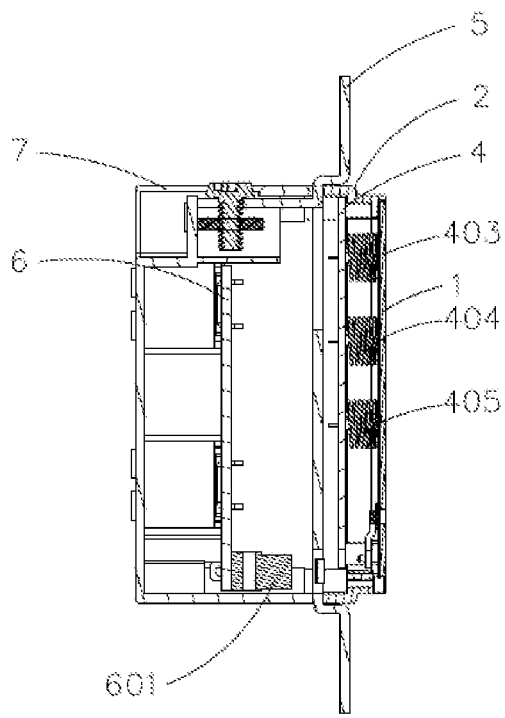
FIG. 3 is a cross-sectional view in a cross-section along the line B-B' of FIG. 1, showing the assembled structure of the touch-sensitive dimmer.
Figure 5:
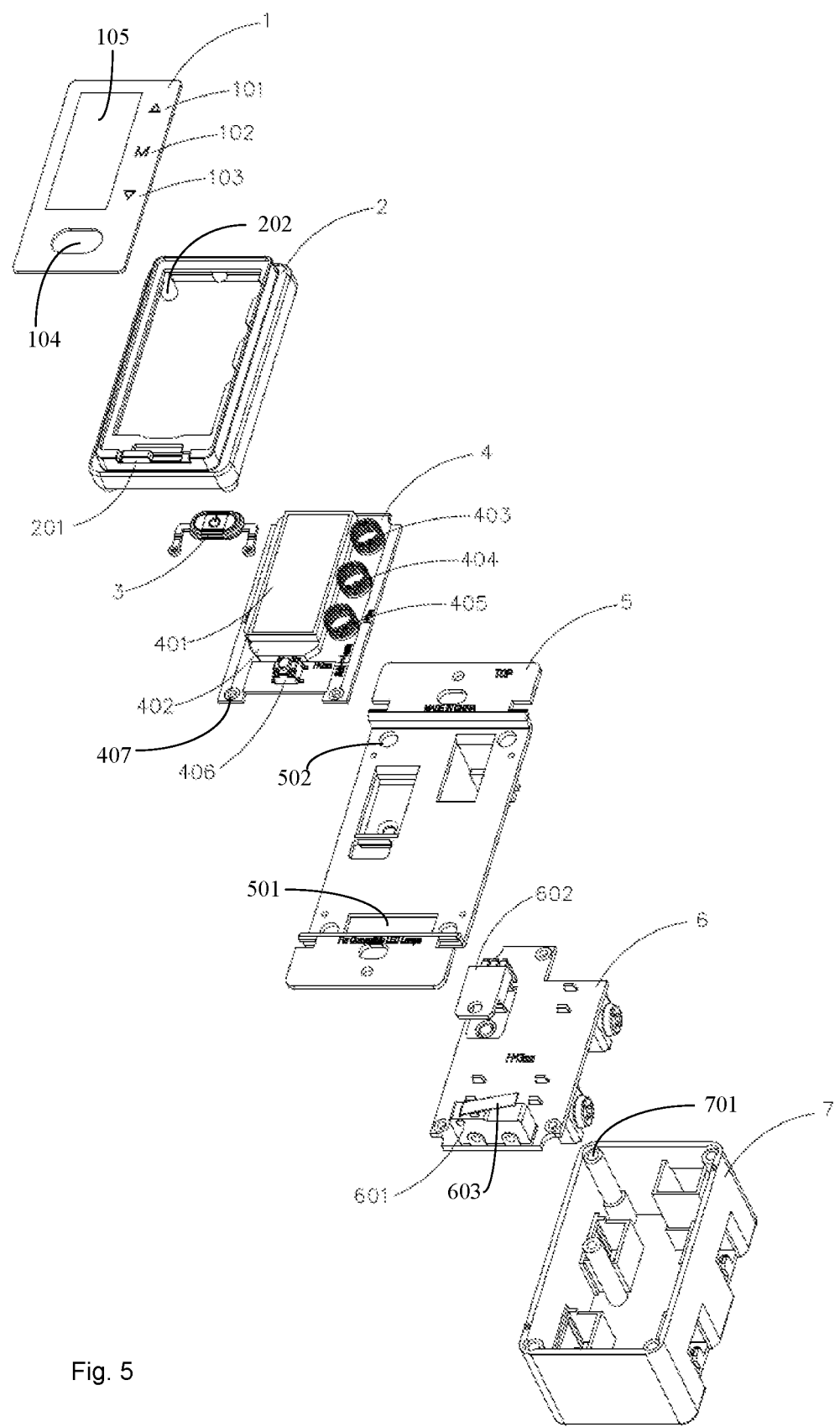
FIG. 5 is an exploded view showing the structure of the touch-sensitive dimmer of FIG. 1.

As shown in the drawings, the dimmer with touch-sensitive control (or "touch-sensitive dimmer" for convenience) according to embodiments of the present invention is electrically coupled to the illumination load of the light source to adjust the illuminance generated by the load. In a preferred embodiment, the touch-sensitive dimmer includes a hollow body 7 and a power source printed circuit board assembly (PCBA) 6 disposed inside the body 7. The touch-sensitive dimmer further includes a control printed circuit board assembly (PCBA) 4 and a touch-sensitive display panel 1. The control PCBA 4 has touch-sensing components and a display element disposed on it. The display element displays the changes of the illumination load adjustment modes based on trigger signals generated by the touch-sensing components. In some embodiments, the display element includes a liquid crystal display (LCD) screen 401 and a backlight plate 402. The touch-sensing components include at least one touch spring, such as three touch springs 403, 404 and 405 shown in the embodiment of FIG. 3 and FIG. 5. The touch-sensitive display panel 1 has touch keys 101, 102 and 103 which respectively correspond to the touch springs 403, 404 and 405, and a display window 105 which corresponds to the LCD screen 401. Using this structure, when the user presses the touch keys, the pressure generated via the touch keys 101, 102 and 103 and the touch springs 403, 404 and 405 controls various conductive states of a touch-sensing control circuit on the control PCBA 4. For example the first touch key 101 may be set to be an "up" key ("Δ") that will cause the control circuit to increase the illuminance, the third touch key 103 may be set to be a "down" key ("∇") that will cause the control circuit to decrease the illuminance, and the second touch key 102 may be set to be a "mode change" key ("M") that will cause the control circuit to change a control mode for the illumination load. It is noted that in preferred embodiments, to ensure reliable trigger by external pressure on the touch keys 101, 102 and 103, the springs 403, 404 and 405 are in a slightly pre-compressed state in the assembled dimmer, but the pre-compression does not generate sufficient pressure to actually change the conductive states of the touch-sensing control circuit without the external pressure on the touch keys by the user.

In some embodiments, the control PCBA 4 is provided with a microswitch 406, which is configured to be triggered by an on/off button 3 on the touch-sensitive display panel 1, to turn on and off the illumination load. Correspondingly, the touch-sensitive display panel 1 is provided with a button opening 104 to accommodate the on/off button 3.

In some embodiments, the power source PCBA 6 is provided with a mechanical switch 601; when the mechanical switch 601 is triggered, it forces a turn off of the light source; in other words, it forces a cut-off of the power supply to the light source to avoid accidents. In the embodiment shown in FIG. 5, the mechanical switch 601 includes a spring plate 603, which can be changed to conducting and non-conducting positions by a mechanical push and pull switch 201. Other implementations of the mechanical switch 601 may also be used.

In some embodiments, advantageously, the touch-sensitive display panel 1 and the control PCBA 4 are assembled together via a faceplate 2 to form a first assembly, and the power source PCBA 6, the body 7 and a grounding frame 5 are assembled together to form a second assembly, and the first assembly and the second assembly are then assembled to form the touch-sensitive dimmer device.

More specifically, first, the power source PCBA 6 is fixedly assembled into the body 7 by fastening devices such as screws. The grounding frame 5 is then assembled with the body 7 via cooperation of multiple positioning holes 502 of the grounding frame 5 and corresponding multiple positioning posts 701 of the body 7 (only one positioning hole and one corresponding positioning post are shown in the drawings as examples). Meanwhile, a silicon controlled rectifier 602 on the power source PCBA 6 is affixed to the grounding frame 5 by screws. This also facilitates heat dissipation of the silicon controlled rectifier. This completes the second assembly (the body assembly).

The touch-sensitive display panel 1 is affixed to the faceplate 2, for example by using an adhesive. The push and pull switch 201 may be disposed on the faceplate 2. Then, the on/off button 3 is hot-melt assembled onto the faceplate 2. Lastly, the control PCBA 4 is assembled with the faceplate 2 by affixing multiple installation holes 407 on the faceplate 2 to corresponding multiple installation posts 202 on the faceplate 2 using screws (only one installation hole and one installation post are shown in the drawings as examples). This way, the touch keys 101, 102 and 103 and the touch springs 403, 404 and 405 on the control PCBA 4 are immediately adjacent and contact each other, to accomplish the touch-sensitive adjustment functions of the touch-sensitive dimmer. The LCD screen 401 and the backlight plate 402 are soldered on the control PCBA 4. Once energized, the touch-sensitive display panel 1 can display relevant information as controlled by the control PCBA 4. This completes the first assembly (the faceplate assembly).

Finally, the faceplate assembly and the body assembly are fastened together using screws, which completes the assembly of the touch-sensitive dimmer.

Figure 4:
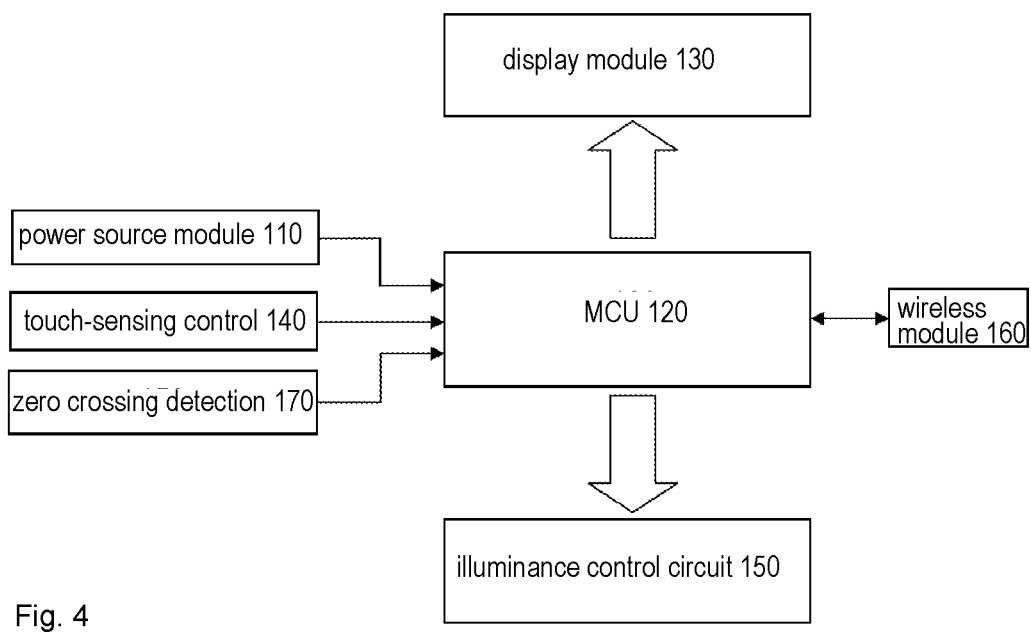
FIG. 4 is functional block diagram of a touch-sensitive dimmer according to an embodiment of the present invention.

Next, the function and operation of the touch-sensitive dimmer are described with reference to FIG. 4.

In terms functional modules, the touch-sensitive dimmer includes a power source module 110, microcontroller unit (MCU) control module 120, display module 130, touch-sensing control circuit module 140, and illuminance control circuit module 150, coupled to each other. The display module 130 displays, based on trigger signals from the touch-sensing control circuit module 140, an illumination load adjustment mode change as effected by the MCU control module 120; and controls the illuminance control circuit module 150 to achieve adjustment of the illuminance of the load.

Preferably, the touch-sensitive dimmer further includes a wireless communication module 160, which can be used to accomplish remote control of the dimmer via a remote control device (such as a mobile phone). The wireless communication may use Wi-Fi technology. For example, after the user uses an application on the mobile phone to transmits a wireless signal to the dimmer, a wireless signal receiving unit of the wireless communication module receives the signal and transmits it to the MCU control module 120 to be processed. The MCU control module 120 analyzes and processes the signal, and outputs a corresponding signal to the illumination load to adjust the illumination. This achieves wireless control of the dimmer.

Preferably, the touch-sensitive dimmer additionally includes a zero crossing detection module 170 for detecting zero crossings of the power supply. Many home electrical appliances use inverters or uninterrupted power supplies. Control of inverters or uninterrupted power supplies typically requires frequency detection of the input power supply as well as phase tracking synchronous with the input power supply; therefore, there is a need to detect zero crossing signals to generate a control signal which can be used to trigger other signals. Thus, accurate detection of zero voltage crossings of the AC power grid is critical. By using the zero crossing detection module 170 to detect zero crossings of the power supply, synchronous carrier data transmission can be realized.

When adjusting the dimmer, the MCU control module 120 detects the zero crossings of the power supply, and uses these time points as reference. Meanwhile, the MCU control module 120 scans the key press states of the touch-sensitive display panel 1, to adjust the conducting time duration of the silicon controlled rectifier (SCR) of the illuminance control circuit module 150, to achieve adjustment of the illuminance. When the touch key 101 ("Δ") is pressed, the conducting time duration is gradually increased and the light source becomes brighter; when touch key 103 ("∇") is pressed, the conducting time duration is gradually decrease and the light source becomes dimmer. When the touch key 102 ("M") is pressed, different commands are transmitted to the MCU control module 120 to accomplish corresponding mode switch.

The touch-sensitive dimmer according to embodiments of the present invention may be used with many different types of illumination loads, including incandescent light (e.g. 600 W), compact fluorescent light (CFL) (e.g. 300 W), light emitting diode light (LED) (e.g. 300 W/120V).

Figure 1:
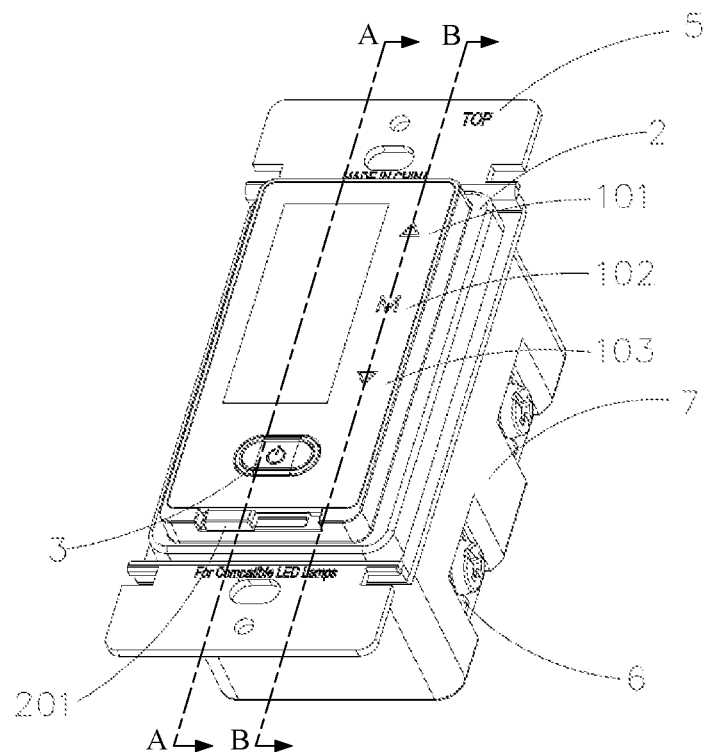
FIG. 1 is an exterior view of a touch-sensitive dimmer according to an embodiment of the present invention.
Figure 2:
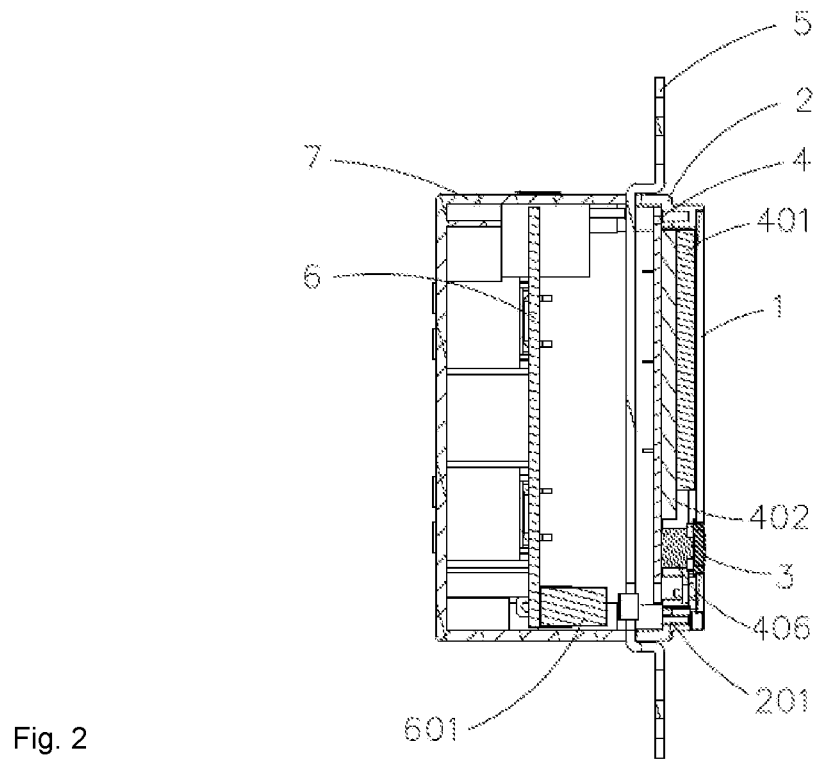
FIG. 2 is a cross-sectional view in a cross-section along the line A-A' of FIG. 1, showing the assembled structure of the touch-sensitive dimmer.

With reference to FIG. 1, examples of the operation of the touch-sensitive dimmer are described below:

1. The on/off button 3 is the button normally used to turn the dimmer on and off. Short presses turn the illumination load on and off. It may be set to have an illuminance memory and a gradual increase/decrease function, to gradually increase the brightness when turning on the illumination load and gradually decrease the brightness when turning off the illumination load. The touch key 102 ("M") is a mode switch key, to change among three adjustment modes, namely an initial brightness adjustment, 5% precision adjustment and 25% precision adjustment. The touch key 101 ("Δ") is the key to increase brightness; consecutive short presses increase the brightness consecutively, while a long press directly increases the brightness to a maximum brightness. The touch key 103 ("∇") is the key to increase brightness; consecutive short presses decrease the brightness consecutively, while a long press directly decreases the brightness to a minimum brightness.

2. When the on/off button 3 is pressed to turn on the device for the first time, all display segments of the LCD screen 401 are displayed, and all keys with indicator lights have their indicator lights illuminated. After 1 second, the device automatically enters a code matching mode; in this mode, the display screen only displays a logo of the wireless communication mode. Long press the on/off button 3 for 3 to 5 seconds, the wireless communication mode logo flashes three times then becomes illuminated constantly, indicating that code matching is complete.

3. To set the three operation modes, short press the touch key 102 ("M") to enter mode 3 to set the initial brightness. Short press the on/off button 3 to turn on the illumination load being controlled. At this time (the first time the load is turn on) the brightness is pre-set to the maximum brightness. Short press the touch key 103 ("∇") to decrease the brightness, while ensuring that the minimum brightness does not cause flicker. This completes the initial brightness setting, with an adjustment precision of 5%.

4. Short press the touch key 102 ("M") again to enter mode 1, then short press the touch key 101 ("Δ") and the touch key 103 ("∇") to adjust the brightness of the illumination load with an adjustment precision of 5%.

5. Short press the touch key 102 ("M") again to enter mode 2, then short press the touch key 101 ("Δ") and the touch key 103 ("∇") to adjust the brightness of the illumination load with an adjustment precision of 25%.

6. Repeated short presses of the touch key 102 ("M") toggles between mode 1 and mode 2.

7. Long press of the touch key 102 ("M") enters mode 3 to set initial brightness.

8. Long press the on/off button 3 for 3 to 10 seconds, and the indicator light of the touch key 102 ("M") will flash and the device will reset to factory defaults.

In some embodiments, after the brightness adjustment of the illumination load is set, the touch-sensitive dimmer has a memory lock function. Further, when performing various setting and function adjustment, the LCD display screen displays feedback information. 5 seconds after the setting operation is complete, the display screen freezes to a display of the current illuminance, and the touch-sensitive dimmer enters a sleep mode. Touching any touch key wakes up the device.

It should be understood that the embodiments shown in FIGS. 1-5 only illustrate and label main components of the touch-sensitive dimmer according to embodiments of the present invention. The shape and spatial arrangements of the various units and components are exemplary only and not limiting. Without departing from the spirit and scope of the present invention, the touch-sensitive dimmer may use components of other shape or size. Moreover, the operations described above are exemplary only and not limiting.

It will be apparent to those skilled in the art that various modification and variations can be made in the touch-sensitive dimmer apparatus of the present invention without departing from the spirit or scope of the invention. Thus, it is intended that the present invention cover modifications and variations that come within the scope of the appended claims and their equivalents.

What is claimed is:

1. A touch-sensitive dimmer, configured to be electrically coupled to an illumination load to adjust an illuminance of the illumination load, comprising:
  a hollow body;
  a power source printed circuit board assembly disposed inside the body;
  a control printed circuit board assembly;
  a touch-sensitive display panel;
  touch-sensing components and a display element disposed on the control printed circuit board assembly;
  wherein the display element is configured to display changes among multiple different illumination load adjustment modes based on trigger signals generated by a first one of the touch-sensing components, wherein the different illumination load adjustment modes define different amounts of illuminance adjustment of the illumination load corresponding to a predefined action of a second one of the touch-sensing components, and wherein the control printed circuit board assembly is configured to, in response to each predefined action of the second one of the touch-sensing components, adjust the illuminance of the illumination load by an amount that is defined by a currently displayed one of the multiple different illumination load adjustment modes; and wherein the touch-sensitive display panel includes touch keys which correspond to the touch-sensing components and a display window which corresponds to the display element, and is assembled with the control printed circuit board assembly.

2. The touch-sensitive dimmer of claim 1, wherein the display element comprises a liquid crystal display screen and a backlight plate.

3. The touch-sensitive dimmer of claim 1, wherein the control print circuit board assembly includes a touch-sensing control circuit, wherein the touch-sensing components include at least one touch spring, and wherein the touch keys and the touch spring are configured to cooperate with each other to generate a pressure which controls conductive states of the touch-sensing control circuit.

4. The touch-sensitive dimmer of claim 1, wherein the control printed circuit board assembly includes a microswitch, wherein the touch-sensitive display panel further includes an on/off button which is configured to trigger the microswitch.

5. The touch-sensitive dimmer of claim 1, wherein the power source printed circuit board assembly includes a mechanical switch which is configured to be triggered to turn off power supply to the illumination load.

6. The touch-sensitive dimmer of claim 1, further comprising a faceplate and a grounding frame, wherein the touch-sensitive display panel and the control printed circuit board assembly are assembled together via the faceplate to form a first assembly, the power source printed circuit board assembly, the body and the grounding frame are assembled together to form a second assembly, and the first assembly and the second assembly are assembled to form the touch-sensitive dimmer.

7. A touch-sensitive dimmer, configured to be electrically coupled to an illumination load to adjust an illuminance of the illumination load, comprising:
   a power source module;
   a microcontroller unit (MCU) control module;
   a display module;
   a touch-sensing control circuit module; and
   an illuminance control circuit module;
   the power source module, the MCU module, the display module, the touch-sensing control circuit module and the illuminance control circuit module being coupled to each other;
   wherein the display module is configured to display, based on a first trigger signal generated by the touch-sensing control circuit module, changes among multiple different illumination load adjustment modes, wherein the different illumination load adjustment modes define different amounts of illuminance adjustment of the illumination load corresponding to a second trigger signal generated by the touch-sensing control circuit module, and wherein the MCU control module is configured to, in response to each second trigger signal, control the illuminance control circuit module to adjust the illuminance of the illumination load by an amount that is defined by a currently displayed one of the multiple different illumination load adjustment modes.

8. The touch-sensitive dimmer of claim 7, further comprising a wireless communication module configured to cooperate with remote control device to remotely control the dimmer.

9. The touch-sensitive dimmer of claim 7, further comprising a zero crossing detection module configured to detect zero crossings of a power supply inputted to the illumination load.

* * * * *